United States Patent [19]

Glenn

[11] Patent Number: 5,362,969

[45] Date of Patent: Nov. 8, 1994

[54] PROCESSING ENDPOINT DETECTING TECHNIQUE AND DETECTOR STRUCTURE USING MULTIPLE RADIATION SOURCES OR DISCRETE DETECTORS

[75] Inventor: Daniel E. Glenn, Mountain View, Calif.

[73] Assignee: Luxtron Corporation, Santa Clara, Calif.

[21] Appl. No.: 52,401

[22] Filed: Apr. 23, 1993

[51] Int. Cl.[5] ............................................ G01N 21/86
[52] U.S. Cl. ..................................... 250/561; 156/626
[58] Field of Search ........................ 250/561, 571, 572; 156/345, 626, 627, 662, 646; 204/192.33, 298.32; 356/355, 357

[56] References Cited

U.S. PATENT DOCUMENTS 5,232,537 8/1993 Yachi ................................. 156/626

*Primary Examiner*—David C. Nelms
*Attorney, Agent, or Firm*—Majestic, Parsons, Siebert & Hsue

[57] ABSTRACT

A detector structure and technique for non-contact monitoring of a process being performed on a surface, such as in semiconductor wafer integrated circuit processing and flat panel display substrate processing, in order to determine when the process has reached endpoint. In one embodiment, multiple small area radiation sources, such as light emitting diodes, are symmetrically arranged around a large area photodetector, and each have similar radiation distribution patterns. In an alternative embodiment, multiple photodetectors are symmetrically arranged around a single light emitting diode with a symmetrical radiation distribution pattern. In either case, the amount of source radiation reflected onto the detector from the surface being processed is not significantly affected by any wobble or tilting of the surface that may occur during processing.

24 Claims, 4 Drawing Sheets

PROCESSING ENDPOINT DETECTING TECHNIQUE AND DETECTOR STRUCTURE USING MULTIPLE RADIATION SOURCES OR DISCRETE DETECTORS

BACKGROUND OF THE INVENTION

This invention relates generally to optical techniques of endpoint detection, particularly those used for monitoring and controlling processes of manufacturing integrated circuits on semiconductor wafers and flat panel displays on large area substrates.

Several non-contact, optical techniques for detecting the endpoint of various semiconductor processing steps are presently being used or have been suggested. Many of these techniques involve directing electromagnetic radiation in the visible or near visible portion of the spectrum from a source onto the surface being monitored, with some of the reflected radiation being captured by a photodetector. An electrical signal output of the photodetector is analyzed while processing of the substrate surface is taking place.

One such technique monitors the development of a photoresist masking layer which has previously been exposed to a light pattern that defines the regions of the layer desired to be totally removed and those desired to remain and act as a mask. A developer solution is applied to the exposed photoresist layer in order to remove material in the desired regions. As material is being removed, the thickness of the layer in those regions gradually decreases. A detectable component of light that is reflected onto the photodetector cycles in intensity between a maximum and a minimum as a result of interference of light from the source reflected from the top of the layer and that reflected from the bottom, since the photoresist material is substantially transparent. When the material in these areas has been removed in order to first expose the surface below, a condition called "breakthrough", the varying optical signal at the photodetector terminates. An electronic processing system receiving the photodetector output signal determines when this occurs for the purpose of either notifying the operator concerning the endpoint condition or automatically terminating the development process at endpoint. A similar monitoring technique is used in a process of etching through a patterned layer of a substantially transparent dielectric material, such as an oxide.

Conversely, a similar technique has also been suggested for monitoring the formation of a layer by counting the number of times that the photodetector output signal cycles between its maximum and minimum values. The number of cycles that has occurred at any particular time is proportional to the thickness of the layer being monitored at that time. When a number of cycles of intensity variation has been counted that corresponds to a desired layer of thickness, the detection of this endpoint condition can cause the formation of the layer to terminate.

A similar light reflective technique is used in the selective removal of an opaque layer of material that has a reflectivity different from that of a layer below. As the material is being removed, by an etching process or otherwise, the reflected signal remains substantially the same until a breakthrough occurs, at which time the signal level changes either up or down depending upon whether the layer below is more or less reflective, respectively, than the layer being processed.

Although the major part of the discussion herein is directed toward applications in processing integrated circuits on semiconductor wafers and forming flat panel displays on large area substrates, the monitoring techniques being described also find application in various other specific fields. For example, the light reflection technique can monitor the progress of any selective or total removal of a layer of material from a substrate.

It is a primary object of the present invention to provide an improved technique for monitoring such processes by a light reflective technique with improved reliability and accuracy.

It is another object of the present invention to provide a source of the reflected light and the photodetector in a single sensor housing that is small, rugged and well suited for hostile industrial processing applications.

SUMMARY OF THE INVNETION

It has been found that undesired artifacts and noise in the photodetector output signal occur if there is sufficient angular movement (wobble) between the substrate being monitored, on the one hand, and the photodetector and the electromagnetic radiation source, usually light, on the other hand. Because such wobble causes a different portion of the incident light distribution to be reflected from the substrate to the photodetector, that new portion is generally not of the same intensity as the initial portion that was so reflected. This change in light intensity appears in the photodetector electrical signal output as noise; that is, there is a variation of the signal that is unrelated to the thickness of the layer or other condition being monitored. Rather, the signal variation is due, usually, to movement of the substrate during the monitored process.

Therefore, according to the present invention, briefly and generally, either a plurality of light sources are positioned around a single photodetector or a plurality of photodetectors are positioned around a single light source, as part of a compact sensor. In either case, any tilt or wobble of the surface being monitored, with respect to the sensor, that causes an undesired variation (noise) in a detected amount of light reflected from the surface, simultaneously provides a compensating change in the detected signal in order to minimize the signal variation. Noise on the sensor output signal that has previously been caused by such wobble is significantly reduced or eliminated.

In the multiple light source embodiment of the present invention, an optical sensor assembly is provided with a plurality of light sources positioned with respect to a single photodetector in a manner that a reduction of light reflected from one light source because of the substrate's movement is made up for, in total or at least in part, by an increase in the amount of light reflected onto the photodetector from another of the light sources. In a preferred embodiment, an even number of four or more such light sources are positioned in a symmetrical pattern around the photodetector, each of the light sources having substantially the same angular intensity distribution about an axis extending in a direction of the propagation of its light beam. In addition to compensating for the effects of substrate wobble, a plurality of light sources also provide an increased photodetector output signal, without the necessity of increasing the photodetector area, since there is more light directed against the substrate for reflection onto the photodetector. This also allows the use of very convenient light-emitting-diodes (LEDs) which do not individually provide a desired level of intensity but do so when several are used together.

According to another aspect of the present invention, the area of the photodetector is made larger than normal, thus monitoring a larger area of the substrate than normally is done. This also increases the photodetector signal level and increases the area of the substrate that is being monitored. When the substrate contains repetitive patterns, such as in the case of integrated circuit or large panel display, it is usually desirable to provide the photodetector area such that it captures light from an area of the substrate that extends roughly over a period of variation of the pattern across it. By controlling the area of the photodetector, the portion of the substrate being viewed by it can be adjusted without the necessity of using lenses or other bulky optical components. This then makes it possible to form the sensor in a very small package that is convenient for monitoring a process step in the formation of electronic or display components, and in other industrial applications.

The use of multiple light sources also increases the area of the substrate that is observed by the photodetector. Spaced apart light sources cause light to be reflected onto the photodetector from spaced apart areas of the substrate. Light is reflected onto the photodetector from a number of different, non-overlapping areas of the substrate equal to the number of light sources being used.

In the multiple detector embodiment of the present invention, an optical sensor assembly is provided with a plurality of individual photodetectors positioned with respect to a single light source in a manner that a reduction of light reflected onto one photodetector because of the substrate's movement is made up for, in total or at least in part, by an increase in the amount of light reflected onto another photodetector from the common light source. In a preferred embodiment, an even number of four or more photodetectors are positioned in a symmetrical pattern around the light source. The light source may be a LED having a symmetrical angular intensity distribution about an axis extending in a direction of the propagation of its light beam.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENT

Figure 1:
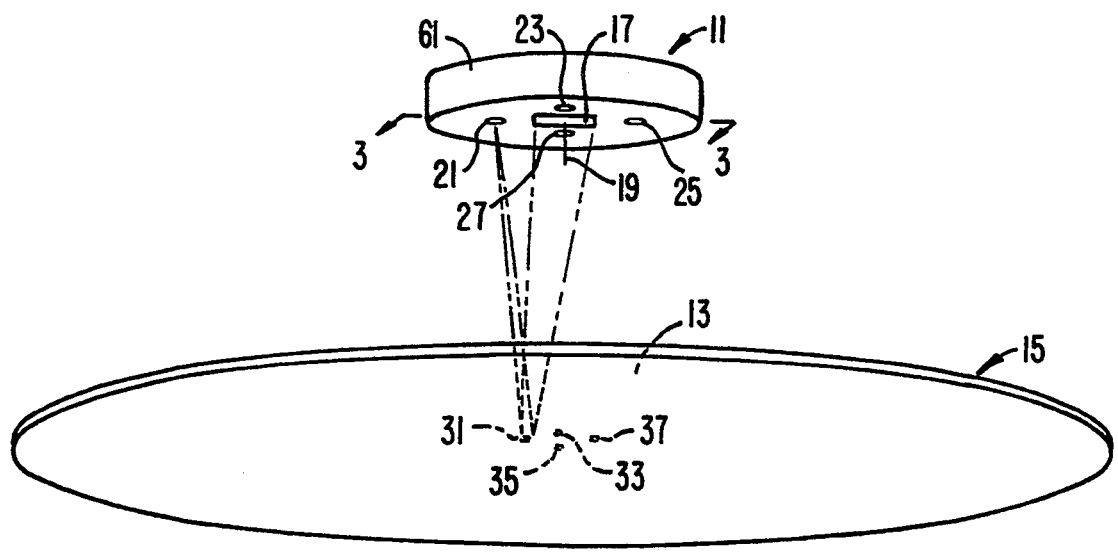
FIG. 1 is an isometric conceptual view of a sensor according to one embodiment of the present invention, showing its use to monitor processing of a surface of a substrate.

Referring to FIG. 1, a sensor assembly 11, schematically shown for simplicity of explanation, is monitoring a surface 13 of a substrate 15 that is being processed. The sensor assembly 11 includes an electromagnetic radiation detector 17, most conveniently a silicon photodiode, positioned with a center coincident with an axis 19. Although the photodetector 17 is shown to be square, since this is the usual configuration, it could also be circular. Surrounding the detector 17 are a plurality of symmetrically positioned sources of electromagnetic radiation within the visible or near visible wavelength range, identified by reference numbers 21, 23, 25, and 27. These light sources are preferably individual LEDs. The LEDs are periodically spaced around a circumference of a circle having a center coincident with the sensor axis 19. In the illustrated case of using four light sources, they are symmetrically separated by an angular distance of 90° around the defined circumference. If three light sources are used, they are spaced an angular distance of 120° apart, if five light sources are used, the spacing becomes 72°, for six light sources, the spacing becomes 60°, and so forth.

Each of the light sources 21, 23, 25, and 27 of the sensor assembly 11 of FIG. 1 is shown to reflect off of separate substrate areas 31, 33, 35 and 37, respectively, onto the photodetector 17. The light sources, such as the preferred LEDs, emit light over a much larger area than one of these areas shown in the substrate surface 13 but it is only light from the surface area shown which will be specularly reflected onto the detector 17. The pattern of the areas 31–37 corresponds to that of the light sources 21–27, except it is smaller. If the light sources 21–27 and the detector 17 are positioned in the same plane or close to it, each of the areas 31–37 of the substrate surface 13 that is reflected back onto the detector 17 is one-quarter the detector area.

Thus, increasing the size of the photodetector 17 correspondingly increases each of the areas 31–37 from which the detector 17 monitors the processing. A size in excess of 36 square millimeters, larger than the usual photodetector, has been found to work well for the detector 17. When four light sources 21–27 are utilized, that means that each of the areas 31–37 on a substrate surface 13 is in excess of 18 square millimeters, an area in excess of 72 square millimeters in total being monitored on the substrate surface 13 by the detector 17. If a number of light sources different than four is utilized, it may be desired to adjust the size of the detector 17 in order to monitor something in excess of a total of 72 square millimeters of the surface 13. For example, if eight light sources are used, instead of the four illustrated in FIG. 1, the size of each of eight areas on the substrate 13 desired to be monitored is nine or more square millimeters, thus requiring the photodetector 17 to be only 18 square millimeters in area, or larger, in order to cover the same amount of area the substrate surface 13.

Therefore, the increase in the number of light sources results in the ability to decrease the area of the photodetector 17 without diminishing the amount of area being monitored on the surface 13 or decreasing the intensity of the signal being received by the photodetector 17. Of course, one advantage of increasing the number of light sources for a given size photodetector is that the area of the substrate monitored by that photodetector increases proportionately, thus increasing the level of the optical signal received by it. All this flexibility and control is provided without the necessity of expensive and bulky lenses or other optical elements to image either the light sources or the detector onto the substrate surface 13.

Figure 2A:
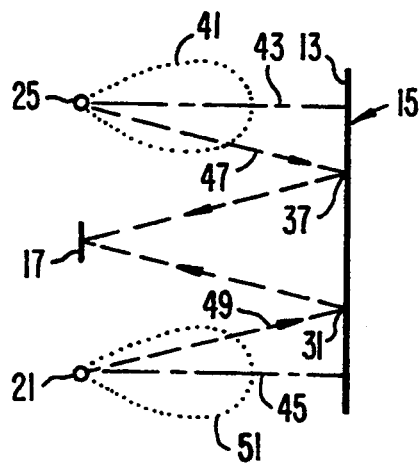
FIGS. 2A and 2B schematically illustrate the operation of the sensor of FIG. 1 when its substrate is positioned at two different angles relative thereto.
Figure 2B:
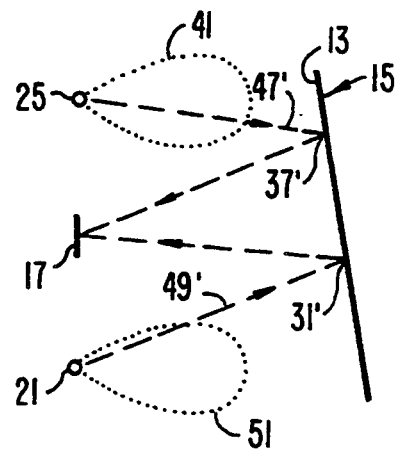

The foregoing advantages of using multiple light sources are not complete, however. A primary advantage of the arrangement of light sources described with respect to FIG. 1 will be understood when the illustrations of FIGS. 2A and 2B are explained. In each, the pair of light sources 21 and 25, positioned on opposite sides of the photodetector 17 on the line drawn through the center 19 of the sensor 11, are shown. Each of the light sources 21-27 is chosen to have a symmetrical radiation emission intensity distribution. This is illustrated in FIGS. 2A and 2B by a lobe 41 that indicates the relative intensity of light emitted from the source 25 at different angles. For example, the maximum emission is along the light distribution's central axis 43 since the distance from the source 25 to the lobe 41 is the maximum along that line. It can be seen that the intensity of light at angles displaced from the center axis 43 decreases as the angular distance from the axis 43 increases. The lobe 41 is three-dimensionally symmetrical about the axis 43, and may be visualized to have a pear like shape. Such a distribution is typical for commercially available LEDs. The light sources 21-27 are chosen to have substantially the same relative intensity distribution.

The effect of these characteristics will now be explained with respect to FIGS. 2A and 2B. When the substrate surface 13 is perpendicular to the central axis 43 of symmetry of the light distribution from the source 25, and similarly to an axis 45 of the source 21, the reflection of respective rays 47 and 49 can be seen from the respective areas 37 and 31 of the substrate surface 13 that is illuminated. The rays 47 and 49 chosen for illustration are those which strike the center of the photodetector 17 and thus are the central rays of the light emanating from their respective sources 25 and 21 which finds its way onto the detector 17. It will be noted, because of the symmetrical conditions described above, that each of these rays strike the respective source intensity lobes 41 and 51 at substantially the same distance from their respective sources. Thus, the intensity of that portion of each of the beams directed against the substrate surface 13, for reflection onto the photodetector 17, is substantially the same.

The difference that exists when the substrate 15 is tilted can be seen by comparing FIG. 2B with FIG. 2A, common elements carrying the same reference number but those which have changed as a result of the tilting substrate being identified with a prime ('). Now the intensity of the ray 47' is much higher than that of the ray 49'. The changed orientation of the substrate 15 with respect to the sensor 11 causes the areas 37' and 31' that reflect light from the respective sources onto the detector 17 to be moved across the surface 13. This results, as is illustrated, in different portions of the light beams from the sources 21 and 25 being used to reflect back into the detector 17. Light from the source 25 in FIG. 2B has a much higher intensity than that from the source 21. This is illustrated in FIG. 2B by the longer distance from the source 25 to the lobe 41 of the central ray 47' than the distance from the source 21 to the lobe 51 of the ray 49'.

It can be seen from FIG. 2B that if only one of the sources 21 or 25 is utilized, as is the current practice, the intensity received by the detector 17 is very much dependent upon the angle of the substrate 15. Thus, any wobble or other movement of the substrate during processing will introduce the noise of a light signal variation onto an electronic signal output of the detector 17. However, using two opposing sources, as shown in FIG. 2B, with the symmetry characteristics of their light distribution and position discussed above, the intensity change from each of the sources is in a different direction, thus significantly reducing or eliminating this undesired noise in the detector output signal. By comparing FIGS. 2A and 2B, it can be seen that the intensity of the ray 47' is caused by the tilting substrate to be larger than that of the ray 47. Conversely, the ray 49' of FIG. 2B is shown to have a intensity less than that of the ray 49 of FIG. 2A.

FIGS. 2A and 2B illustrate the compensation for a one-dimensional tilt of the substrate 15. Compensation for a tilt in an orthogonal direction is provided by the second pair of light sources 23 and 27 utilized in the example of FIG. 1. Because of the symmetry of the intensity distribution of each of these light sources, this pattern of four sources 21-27 compensates for a tilt of the substrate 15 in any direction. An even number of such light sources symmetrically positioned around the photodetector gives the best results but any number of three or more light sources provides an improvement over use of a single light source with a single photodetector.

One other point of symmetry should be noted from FIG. 2A. It is generally most convenient for the sources to be held within the sensor 11 with their respective axes, such as the axes 43 and 45 for the respective sources 25 and 21, perpendicular to a plane in which the photodetector 17 lies. This is not a requirement to obtain the compensating effect described above but it is most convenient in operation. If the light sources are tilted in any way within the sensor 11, their respective axes should make substantially the same angle with the axis 19 of the sensor 11. The axis 19 is defined to be perpendicular to the planar photodetector 17 illustrated in this example.

Figure 3:
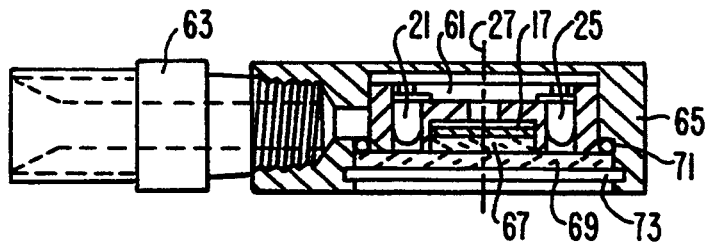
FIG. 3 is a sectional view of a commercial form of a sensor that includes that of FIG. 1, taken at section 3—3 thereof.

FIG. 3 is a cross-sectional view of complete sensor structure that utilizes the basic sensor 11 of FIG. 1. A circular case 65 has a hollow member 63 threadedly attached to it in order to carry the necessary electrical conductors into the center of the case 65 to connect with the photodetector 17 and each of the four light sources that are preferably LEDs. A carrier 61 of the sensor 11 is positioned within the case 65. An optical filter 67 is positioned immediately in front of the detector 17 and abutting an inside surface of a transparent window 69. The window 69 is pressed against an O-ring 71 by an outer ring 73 that snaps into a groove provided for it in the case 65. The filter 67 is chosen to block the visible wavelength band. Examples of the wavelength range of the LEDs chosen for the light sources 21-27 include 880 or 950 nanometers.

Figure 4:
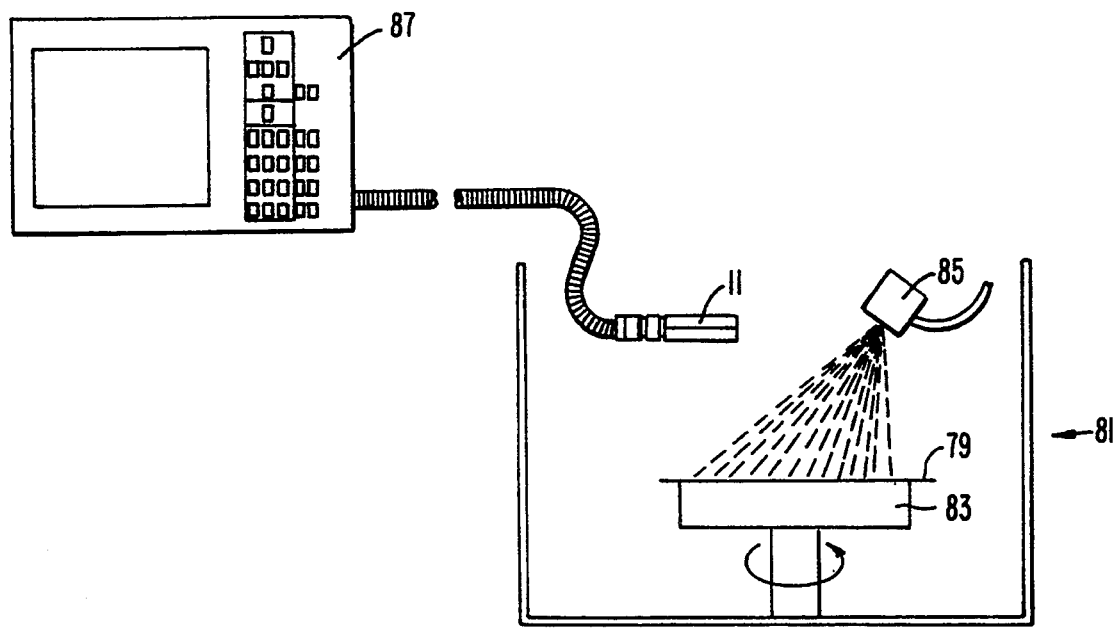
FIG. 4 shows the use of the sensor assembly of FIG. 3 during processing of a semiconductor wafer by spraying liquid onto it.

The structure of FIG. 3 provides a very compact and environmentally rugged sensor that can be used in a number of processing environments. FIG. 4 shows one such environment where a substrate 79 is carried within a tank 81 on a rotating vacuum chuck 83. In order to develop a photoresist layer on the surface of the substrate 79, or etch through the dielectric layer according to a masked pattern, for example, a development or etching solution is sprayed onto the substrate 79 from one or more nozzles 85. The sensor 11 has its detector and LEDs connected to an instrument 87 for monitoring the process on the surface of the substrate 79 nd calculating breakthrough, endpoint and the like. Such an instrument 87 that is commercially available is a 2,000 series unit from Luxtron Corporation, assignee of the present application.

Figure 5:
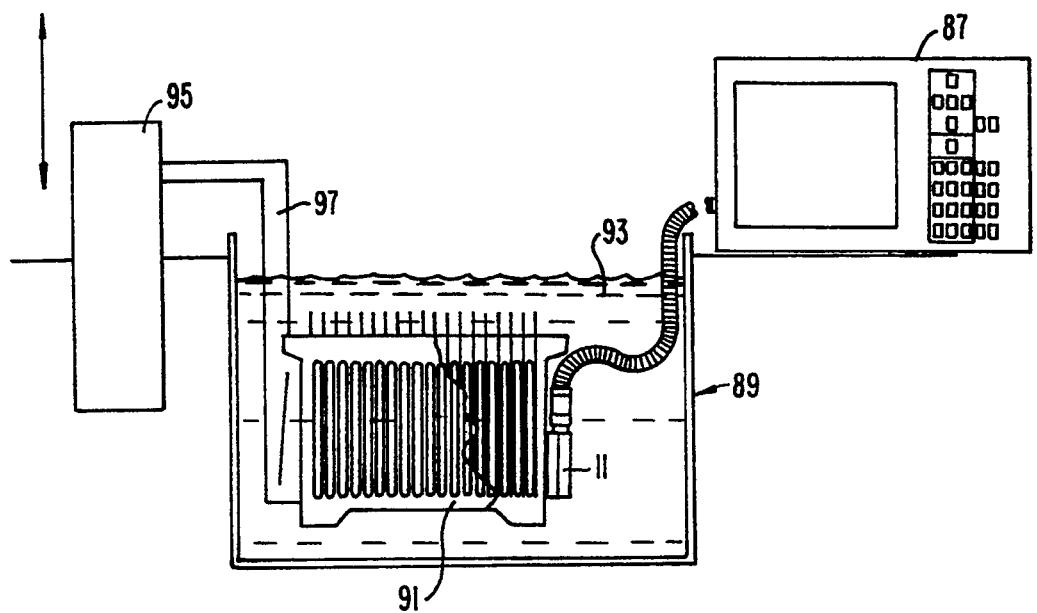
FIG. 5 shows the use of the sensor of FIG. 3 during semiconductor wafer processing involving submersion of both the wafers and the sensor in a liquid bath.

Similarly, with reference to FIG. 5, an immersion tank 89 carries a number of wafers held vertically in a carrying basket 91 that is submersed within a processing solution 93. A motor 95 agitates the solution 93 through a robot arm 97.

The fact that the sensor of FIG. 3 is constructed to be sealed against liquids allows applications such as FIGS. 4 and 5. Its compactness even allows the sensor 11 to be positioned within the basket 91 of FIG. 5 in place of only one or two of the substrates, thereby making it very useful when the substrates are silicon wafers since the capability of the process tank is not significantly reduced by such a configuration. It will also be noticed from FIGS. 4 and 5 that there is an opportunity for the substrates to wobble. In FIG. 4, the semiconductor wafer 79 is rotated, thus almost certainly causing some wobble, and the semiconductor wafers in FIG. 5 are moved under the influence of the moving solution 93. By significantly reducing, if not completely eliminating, the sensitiveness of the sensor 11 to such wobble, the results of the process monitoring are greatly improved.

Figure 6:
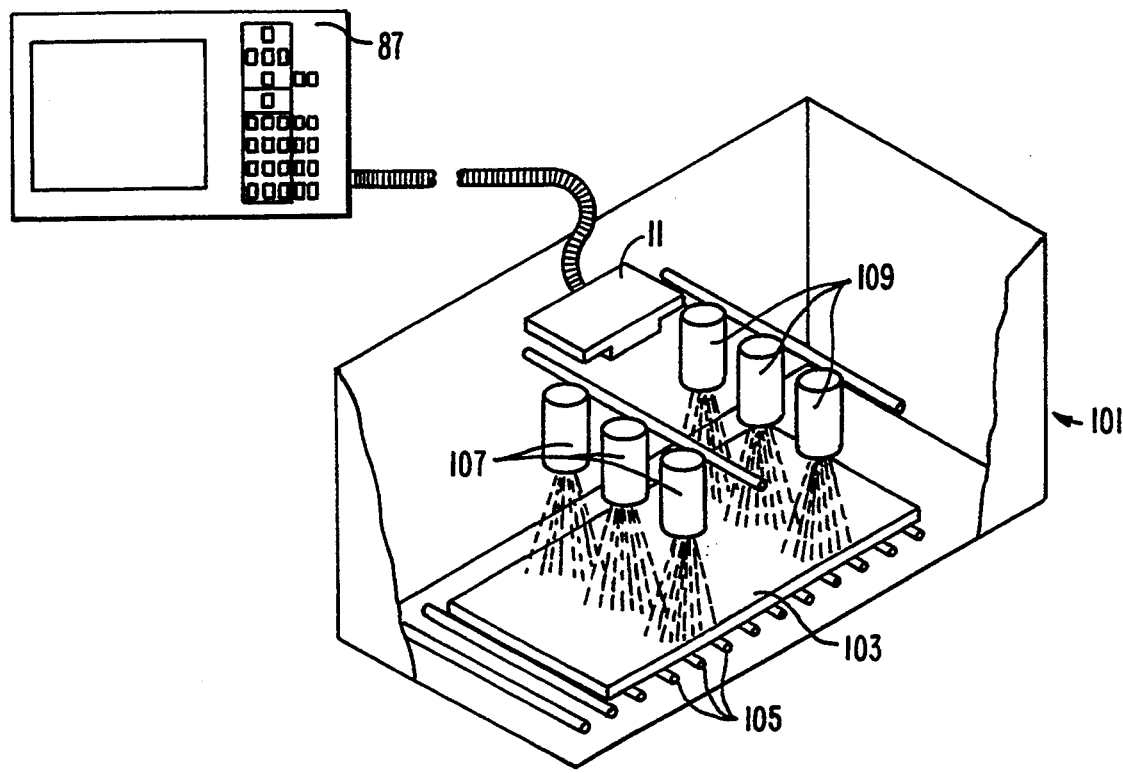
FIG. 6 illustrates the use of the sensor of FIG. 3 in monitoring the processing of a large area flat panel display by spraying liquid onto it.
Figure 7:
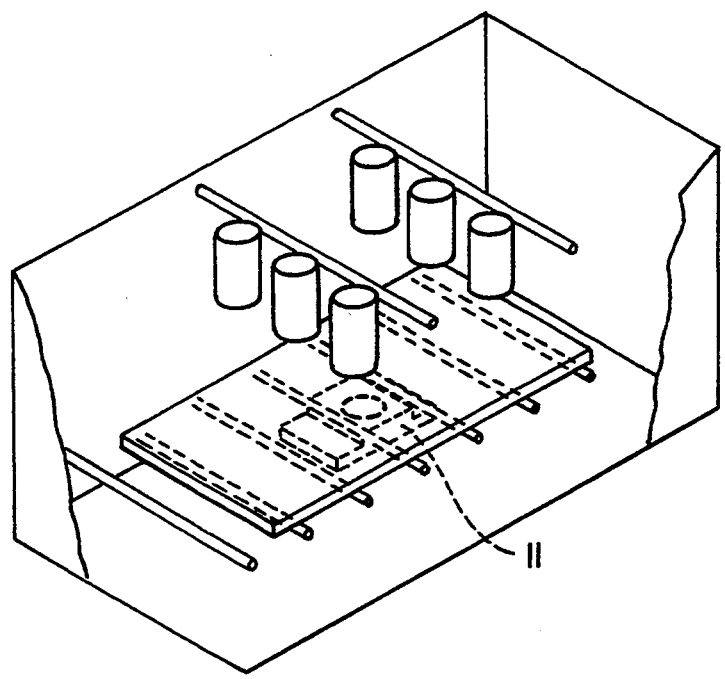
FIG. 7 illustrates the use of the sensor assembly of FIG. 3 by positioning it underneath the large area substrate being processed to form a flat panel display.

Two other similar applications illustrated in FIGS. 6 and 7 will be briefly described. In FIG. 6, a tank 101 carries a substrate 103 that is being processed to manufacture a flat panel display. The substrate 103 is rolled back and forth by rollers 105 under a plurality of spray nozzles 107 and 109. The sensor 11 is held above the substrate 103 in between the two rows of spray nozzles 107 and 109. Alternately, the sensor 11 can be positioned under the substrate 103, as illustrated in FIG. 7. Because the substrate 103 is moved back and forth, the wobble insensitivity of the sensor 11 is a great advantage.

The example described above for the sensor 11 utilizes LEDs for light sources and a photodetector without use of any lenses or other optical elements, in order to produce a very compact and rugged sensor system. However, where compactness or ruggedness are not as important, such optical elements can be utilized. For example, rather than utilizing four LEDs as part of the sensor 11, optical fibers could instead be terminated where the LEDs are shown to be positioned, light being inserted into the optical fibers by a common light source or separate sources for each optical fiber. The pattern of light exiting an end of an optical fiber has the desired symmetry of intensity distribution about an axis of the optical fiber. Additionally, or alternatively, other optical elements can be used to shape that intensity distribution. Further, the detector 17 can be removed from the sensor 11 itself and optically communicate with the sensor by a bundle of optical fibers or an alternative optical system.

Another variation in the specific sensor embodiment described above that is useful in certain circumstances is to provide at least a second set of LEDs having a different wavelength emission than that of the first set. This allows some selectivity in environments where the light must travel from the sensor through a spray or liquid. One set of LEDs or the other can be chosen depending upon whether the liquid or spray is more transparent to one or the other. The second set of LEDs is preferably positioned around the same circumference as the first set discussed above but angularly displaced from them. The same symmetrical positioning as discussed above with the first set of LEDs would be utilized. The detector filter 67 (FIG. 3) would, of course, be selected to have a bandwidth sufficiently broad to pass the wavelength of both of sets of LEDs but still excluding as much ambient light as possible.

Figure 8:
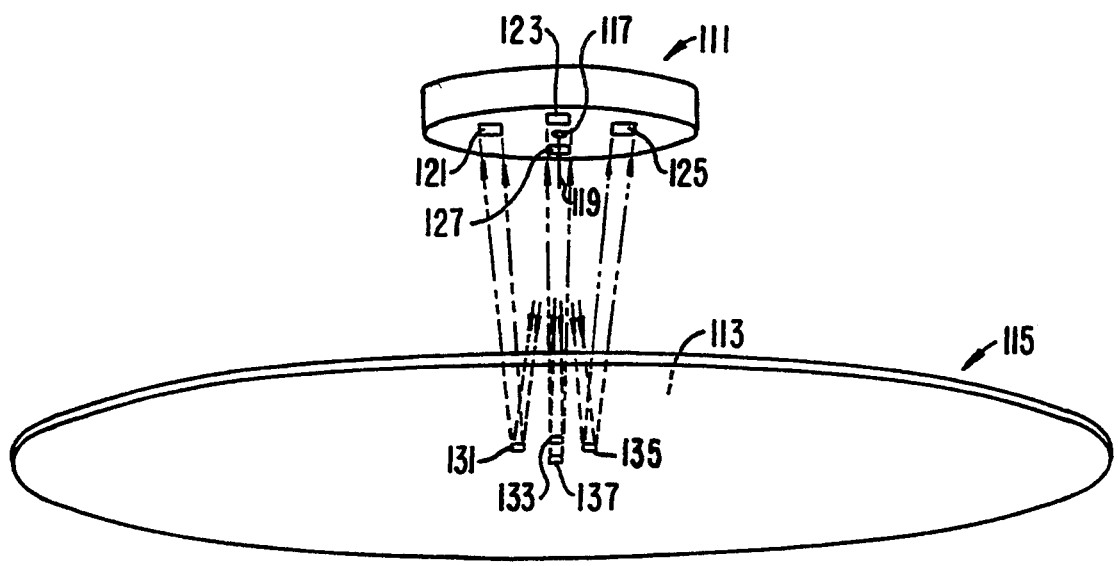
FIG. 8 is an isometric conceptual view of a sensor according to an alternative embodiment of the present invention, showing its use to monitor processing of a surface of a substrate.

As an alternative to using a single detector and multiple LEDs, the arrangement can be reversed; that is, the wafer wobble insensitivity of the present invention can also be achieved by a detector structure having a single LED with a plurality of individual photodetectors, preferably an even number of four or more, symmetrically arranged around the LED. Such an embodiment is shown in FIG. 8. A sensor assembly 111 monitors a surface 113 of a substrate 115 that is being processed. The sensor assembly 11 includes an LED 117 on an axis 119. Four photodetectors 131, 133, 135 and 137 are spaced at 90° intervals around a circle having a center at the axis 119. Alternately, three or five or more photodetectors can be periodically spaced around such a circle.

In the four detector embodiment of FIG. 8, light from the LED 117 is reflected onto the photodiode 121 from an area 131 of the surface 113. The area 131 will be one-quarter the area of the photodetector 121 if the LED 117 and the photodetector 121 are positioned on the same plane. Similarly, light from an area 133 is reflected onto the detector 123, that from an area 135 onto the detector 125, and light from a surface area 137 is reflected onto the detector 125. When the surface 113 tilts (wobbles) with respect to the sensor assembly, the light intensity received by one detector decreases while that of an opposite detector provides a compensating increase. The photodetectors are chosen to have substantially the same area and otherwise to have similar sensitivities. The electrical outputs of all the photodetectors are combined into a single output that exhibits this compensating characteristic.

The following United States patents and pending patent applications, all assigned to either Luxtron Corporation, assignee of the present application, or its subsidiary Xinix, Inc., are incorporated herein by this reference, on account of their discussion of applications of sensors of the type to which the present invention pertains and of ways in which the electrical photodetector output signal is processed: U.S. Pat. Nos. 5,138,149, 5,166,525, 5,190,614 and 5,196,285 and application Ser. Nos. 07/578,056,U.S. Pat. No. 5,190,614 07/896,132, U.S. Pat. No. 5,308,447 07/896,137 and 07/946,942.

Although various aspects of the present invention have been described with respect to their preferred embodiments, it will be understood that the invention is entitled to protection within the full scope of the appended claims.

It is claimed:

1. In a method of directing radiation against a surface being processed and thence onto a radiation detector in order to detect when an endpoint of the process is reached, a method of minimizing an effect on a level of radiation detected by any tilting of the surface, comprising the steps of:

directing said radiation against the surface from at least four positions forming a substantially symmetrical pattern, causing the radiation emanating from each of said positions to have substantially the same radiation emission intensity distribution about each of the positions, and locating the radiation detector at a position that is substantially symmetrically located within said at least four radiation emission positions.

2. The method according to claim 1 wherein the radiation directing step includes positioning a light emitting diode at each of said at least four positions.

3. The method according to claim 1 wherein the radiation directing and detector locating steps include locating each of the four radiation emanating positions and the detector in a common surface that is substantially a plane.

4. The method according to claim 1 wherein the surface being processed is across a semiconductor wafer.

5. The method according to claim 1 wherein the surface being processed is across a flat panel display substrate.

6. The method according to claim 1 wherein the radiation detector locating step includes positioning a silicon chip within the radiation emission positions.

7. The method according to claim 1 wherein the radiation detector locating step includes positioning a detector having an area in excess of thirty-six square millimeters.

8. The method according to claim 2 wherein the radiation directing and detector locating steps include locating each of the at least four light emitting diodes and the detector within an enclosure sealed against entry of fluids.

9. The method according to claim 8 wherein the sealed enclosure is submersed within a liquid bath in which the surface being processed is also submersed.

10. The method according to claim 8 wherein the sealed enclosure is positioned within a spray of a liquid being directed against the surface being processed.

11. The method according to claim 2 wherein the radiation directing step includes positioning light emitting diodes having a wavelength of emission of either about 880 or 950 nanometers.

12. The method according to claim 1 wherein the radiation directing step includes directing said radiation against the surface from an even number of positions.

13. In a method of detecting when an endpoint is reached in a process taking place on a surface, said method including directing radiation against the surface and thence onto a radiation detector positioned a distance from the surface, the improvement comprising:

directing the radiation against said surface from at least four light sources having substantially the same radiation emission intensity distribution and arranged in a pattern across a plane that is substantially symmetrical around an axis perpendicular to said plane, and providing the radiation detector with an axis positioned substantially coincident with the axis of the plane and within the pattern of light sources.

14. In a method of detecting when an endpoint is reached in a process taking place on a surface, said method including directing radiation against the surface and thence onto a radiation detector positioned a distance from the surface, the improvement comprising:

directing the radiation against said surface from a light source with a beam having a distribution that is substantially symmetrical around an axis along said beam, and providing the radiation detector in a form of at least four individual photodetectors arranged in a symmetrical pattern around said light beam.

15. The method according to claim 14 wherein the surface being processed is across a semiconductor wafer.

16. The method according to claim 14 wherein the surface being processed is across a flat panel display substrate.

17. An endpoint detector, comprising:

an enclosure having at least one substantially transparent wall, a photodetector carried within said enclosure in a position to receive radiation through said transparent wall, and an array of at least four sources of radiation positioned substantially symmetrically around said photodetector in positions to transmit radiation through said transparent wall, each of said at least four sources of radiation having substantially the same symmetrical radiation emission intensity distribution.

18. The endpoint detector of claim 17 wherein said array of at least four sources of radiation includes an array of at least four light emitting diodes.

19. The endpoint detector of claim 18 wherein said at least four light emitting diodes emit a narrow band of wavelengths including either 880 or 950 nanometers.

20. The endpoint detector of claim 17 wherein said photodetector includes a silicon chip with an area in excess of thirty-six square millimeters.

21. The endpoint detector of claim 20 wherein said array of at least four sources of radiation includes an array of at least four light emitting diodes that emit a narrow wavelength band of radiation, and wherein the endpoint detector additionally includes a narrow bandpass filter that passes the wavelength band of radiation of said light emitting diodes and is positioned between said chip and said enclosure window.

22. An endpoint detector, comprising:

an enclosure having at least one substantially transparent wall, a source of radiation carried within said enclosure in a position to transmit radiation through said transparent wall, said radiation source having a symmetrical radiation emission pattern, and an array of at least four individual photodetectors positioned within said enclosure in a pattern that is substantially symmetrical around said radiation source to receive radiation through said transparent wall.

23. A substrate processing system, comprising:

a processing tank, means within said tank for carrying and moving a substrate with respect thereto, means within said tank for applying processing liquid to said substrate, and an endpoint detector positioned opposite said substrate, said endpoint detector including:

an enclosure having at least one substantially transparent wall facing toward said substrate, a photodetector carried within said enclosure in a position to receive radiation through said transparent wall, and an array of at least four sources of radiation positioned substantially symmetrically around said photodetector in positions to transmit radiation through said transparent wall, each of said at least four sources of radiation having substantially the same symmetrical radiation emission intensity distribution.

24. A substrate processing system, comprising:

a processing tank, means within said tank for carrying and moving a substrate with respect thereto, means within said tank for applying processing liquid to said substrate, and an endpoint detector positioned opposite said substrate, said endpoint detector including:

an enclosure having at least one substantially transparent wall facing toward said substrate, a source of radiation carried within said enclosure in a position to transmit radiation through said transparent wall, said radiation source having a symmetrical radiation emission pattern, and an array of at least four individual photodetectors positioned within said enclosure in a pattern that is substantially symmetrical around said radiation source to receive radiation through said transparent wall.

* * * * *